Dec. 24, 1957 D. A. JENNY 2,817,607

METHOD OF MAKING SEMI-CONDUCTOR BODIES

Filed Aug. 24, 1953

INVENTOR.
Dietrich A. Jenny

BY

ATTORNEY

United States Patent Office 2,817,607
Patented Dec. 24, 1957

2,817,607

METHOD OF MAKING SEMI-CONDUCTOR BODIES

Dietrich A. Jenny, Princeton, N. J., assignor to Radio Corporation of America, a corporation of Delaware Application August 24, 1953, Serial No. 376,120

7 Claims. (Cl. 148—1.5)

This invention relates to methods and apparatus for making semi-conductor devices having p-n rectifying junctions, and more particularly to methods and apparatus for making such devices by a diffusion process.

It is known to make a semi-conductor device such as a transistor by an alloy-diffusion technique. The alloy-diffusion technique comprises alloying a relatively small body of a conductivity type-determining impurity-yielding material of one conductivity type into a portion of a semi-conductor body of opposite conductivity type. The impurity-yielding material changes the conductivity type of a portion of the semi-conductor body into which it is alloyed and produces a p-n rectifying junction adjacent this portion in the semi-conductor body.

It is also known to make a p-n rectifying junction in a semi-conductor body by diffusion alone. Previous methods of making p-n rectifying junctions by this technique have included placing a relatively thin film of a conductivity type-determining impurity-yielding material of one conductivity type upon a surface of a semi-conductor body of opposite conductivity type and heating the body to a temperature substantially above the melting point of the impurity-yielding material. The impurity-yielding material thus is caused to penetrate through the surface and diffuse throughout a region of the body adjacent the surface. The diffused impurity-yielding material changes the conductivity type of the region and forms a p-n rectifying junction between the region and the remainder of the body.

One of the principal problems in making a p-n rectifying junction by diffusion alone is to provide a uniform and intimate contact between the impurity-yielding material and the surface of the semiconductor body.

Another problem is encountered in utilizing such a junction. It is relatively difficult to locate and to make an electrical contact to the region into which the impurity-yielding material has been diffused.

Accordingly it is an object of the instant invention to provide improved methods of making semi-conductor devices by diffusion.

Another object is to provide novel apparatus for making semi-conductor devices by diffusion.

Another object is to provide novel and improved methods of making p-n rectifying junctions in semi-conductor bodies.

In accordance with the instant invention, a p-n rectifying junction may be formed within a semi-conductor body by diffusion of an impurity-yielding material into the body at a temperature below the melting points of both the body and the impurity-yielding material. Diffusion is facilitated by insuring intimate contact between the impurity-yielding material and the semi-conductor body by means of pressure.

The invention may be more fully understood by reference to the following detailed description and to the drawing of which:

Similar reference characters have been applied to similar elements throughout the drawing.

Figure 1:
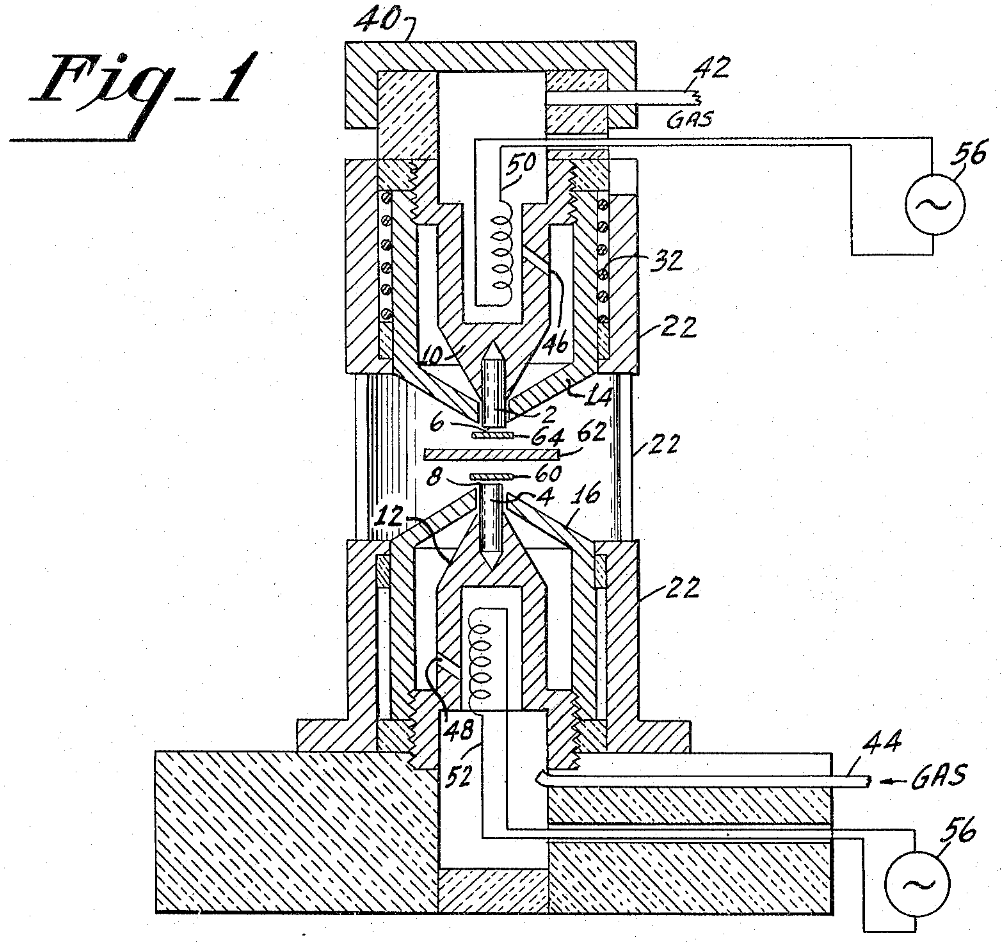
Figure 1 is a schematic, cross-sectional, elevational view of apparatus according to the instant invention.

A transistor device in accordance with the invention may be conveniently made in an apparatus as shown in Figure 1. This apparatus comprises a pair of opposed contact pressure pins 2 and 4 of a relatively hard metal such as stainless steel, having polished, flat, contact surfaces 6 and 8. The pins are held in holes in the ends of a pair of hollow studs 10 and 12 which may be of any conductive metal such as brass. A pair of cup-shaped housings 14 and 16 respectively surround and partially enclose the stud and pin assemblies. The apices of the housings are perforated and the ends of the pins project through and extend a short distance beyond the perforations. The pins are slightly smaller than the perforations and are centered within them to allow a space between the pins and the walls of the housings for a flow of gas. The walls of the studs are provided with apertures 46 and 48 to allow the passage of a gas from within the studs into the space between the housings and the studs. The two housing assemblies are oppositely mounted on a rigid frame 22. The upper housing is spring floated by the spring 32 so that it may travel downward toward the lower housing to force the two pressure pins into contact with each other.

Heating means such as the electric resistance coils 50 and 52 are located within the respective studs to heat the pressure contact pins by conduction. Gas inlet tubes 42 and 44 are provided to conduct a desired gas into the interiors of the studs.

According to a preferred embodiment of the instant invention a p-n-p diffusion junction transistor may be produced by utilizing the apparatus shown in Figure 1 in the following manner. A disc 60 of a p-type impurity-yielding material such as indium approximately equal in diameter to one of the pressure pins is placed upon the contact surface 8 of the lower pressure pin 4. A wafer 62 of single crystal n-type semi-conductive germanium about .005" thick and substantially larger than the impurity-yielding disc is laid upon the disc. A second impurity-yielding disc 64, similar to the first, is laid upon the opposite surface of the germanium wafer in alignment with the contact surface 6 of the upper contact pressure pin 2. A downward force is exerted upon the cover plate 40 of the upper housing assembly to force the assembly downward against the floating spring 32 and to cause the pressure pin 2 to press upon the upper indium disc 64. This force should be sufficient to produce a pressure of about 1000 to 10,000 pounds per square inch upon the materials held between the two pressure pins. For example, if the contact surfaces are about .030" in diameter, a force of about one pound exerted downward on the cover plate produces a pressure of about 1400 pounds per square inch between the pressure pins.

A stream of an inert or reducing gas such as argon or hydrogen is introduced through the gas inlets 42 and 44 and flows through the studs into the housings and around the pressure contact pins to bathe the surfaces of the indium and germanium in a protective atmsophere. The use of a protective atmosphere is not essential, but is highly desirable in order to minimize oxidation of the material of the device being formed and to provide more uniform results.

The heating elements 50 and 52 are connected to a suitable electric power source 56 and the studs are heated sufficiently to raise the temperature of the impurity-yielding discs and the germanium wafer to a value a few degrees below the melting point of the indium. The pressure, gas flow and temperature may be maintained for about 30 minutes to several hours to diffuse the indium into the germanium wafer. As the indium diffuses into the wafer, two oppositely disposed p-n rectifying junctions are formed within the wafer. After about 30 minutes or longer the heating is discontinued and the device is allowed to cool in the stream of gas. When cool, the device may be removed from the apparatus and conventionally etched, mounted and potted.

Figure 2:
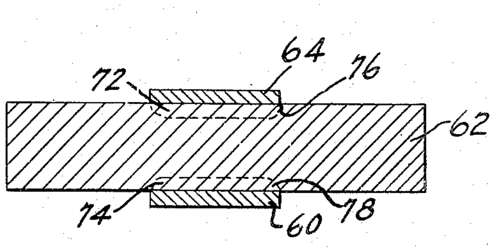
Figure 2 is a schematic, cross-sectional, elevational view of a device according to the invention.

A device formed according to the instant invention is illustrated in Figure 2. The device comprises an n-type semi-conductive germanium wafer 62 having two oppositely disposed discs 60 and 64 of indium bonded to its surface. Adjacent the discs within the wafer are p-type semi-conductive regions 72 and 74 formed by the diffusion of indium into the germanium wafer. Adjacent these p-type regions are the p-n rectifying junctions 76 and 78. One of the indium discs may be conveniently employed in a circuit as an emitter electrode. The other disc may be employed as a collector electrode, and a base connection may be made to the germanium wafer.

In the process described in connection with the preferred embodiment, it is desirable that both the wafer and the impurity-yielding material discs be thoroughly clean at the commencement of the process. In the case of indium a simple rinse in acetone is usually sufficient. In the case of germanium or silicon, a more rigorous treatment has been found desirable. Germanium may be cleaned by any convenient means generally suitable in transistor production. For example, it may be etched for about one minute in a solution comprising concentrated nitric acid and concentrated hydrofluoric acid, rinsed in triple-distilled water and then rinsed in triple-distilled acetone. In general, any method of cleaning germanium which will remove substantially all impurities from the surface, including compounds of germanium, without unduly disturbing its atomic crystal structure, is satisfactory. The same degree of cleanliness is desirable when cleaning the discs of impurity-yielding material. In the case of the discs, however, it is not essential that the cleaning be accomplished without disturbing the crystal structure of the material.

The practice of the instant invention is not limited to the device produced according to the preferred embodiment heretofore described nor to devices utilizing the particular materials described. The invention is generally applicable to the production of various diffusion type semi-conductor devices of varying forms and utilizing different materials. For example, in place of indium other p-type impurity-yielding materials may be substituted with equally satisfactory results. Materials such as aluminum and gallium also yield p-type impurities in semi-conductive materials such as germanium and silicon and may be utilized. Correspondingly, an n-p-n device may be produced utilizing a wafer of p-type semi-conductive material and discs of an n-type impurity-yielding material. In this case the discs may be conveniently composed of an alloy of lead with antimony, arsenic or bismuth or any other relatively ductile alloy containing p-type conductivity yielding material.

The impurity-yielding material should be relatively malleable and ductile compared to the semi-conductive wafer against which it is pressed. Ductility and malleability are necessary in order to insure intimate contact between the impurity-yielding material and the semi-conductive wafer. These properties also minimize breakage of devices during forming by the process.

The cohesive forces of impurity-yielding materials suitable for use in the practice of the invention are sufficient to maintain a significant thickness of the material between the wafer and the contact pressure pin. Even though it might be thought that a ductile material would tend to flow out from between the wafer and the pressure pin sufficient material remains between the wafer and the pin to diffuse into the wafer and to form a visible electrode upon the surface of the wafer.

The size of the impurity-yielding material disc is not critical. In the interest of economy it may be desired to make the disc about the same size as the contact pressure pin and as thin as can be conveniently handled. If the disc is significantly larger than this its effective size will be reduced by the pressure pins and diffusion will take place into the semi-conductive wafer throughout an area of substantially the same size as the contact surface of the pressure pin.

The size of the semi-conductive wafer utilized in the practice of the invention is not critical. Since diffusion at temperatures below the melting points of the diffusing materials proceeds at a relatively slow and well controlled rate, the semi-conductive disc may be made relatively thin, for example .001", without danger of causing the two opposite p-n rectifying junctions to meet within the wafer. It should also be understood that the practice of the instant invention is not limited to a device having two p-n rectifying junctions but is equally applicable to semi-conductor devices having fewer or more than two such junctions.

In the practice of the invention it has been found that the rate of diffusion is primarily dependent upon the materials used and the temperature at which the process is carried out. The principal function of the pressure appears to be to insure complete and intimate contact between the impurity-yielding material and the semi-conductive body. Different degrees of pressure are required to secure such intimate contact when using different materials. For example, a relatively light pressure such as about 1000 p. s. i. is sufficient to secure good contact when using a relatively soft metal such as indium. A relatively high pressure such as about 10,000 p. s. i. is necessary to produce good contact when utilizing a relatively hard metal such as aluminum. The time of maintaining pressure and temperature is relatively important in the practice of the invention. A relatively long time and a relatively high temperature permit a relatively deep diffusion of the impurity-yielding material into the wafer and produce p-n rectifying junctions located relatively deeply within the wafer. A relatively short time and a relatively low temperature provide a device having p-n rectifying junctions relatively close to the surface.

The apparatus shown and described is not critical but merely a convenient form particularly well adapted to the production of semi-conductor devices such as transistors. The invention includes equivalent forms of apparatus and methods for compressing semi-conductor materials while simultaneously heating them and maintaining them within a protective atmosphere. The apparatus illustrated is readily adaptable to be operated by automatic pneumatic or hydraulic driving means. It may also be utilized in ganged array to make a plurality of semi-conductor devices simultaneously.

Devices produced in accordance with the instant invention have the advantage of providing one or more readily visible electrodes to which electrical contact may be easily made by soldering or by any other convenient method. The use of relatively high contact pressures according to the instant invention provides a relatively high degree of uniformity in successive devices produced thereby. The relatively high pressures insure uniform contact between the discs and the wafers. The process does not depend upon any wetting action induced by heat between a molten substance and a solid semi-conductor.

What is claimed is:

1. A method of making a P-N rectifying junction in an N-type semiconductive body comprising the steps of pressing a mass of conductivity type-determining material selected from the group consisting of indium, aluminum, and gallium, upon the surface of said body at an elevated temperature below the melting points of said body and of said material, thereby to cause a portion of said material to diffuse into said body to change the conductivity type of a region of said body to P-type and to form a P-N rectifying junction in said body adjacent said region.

2. The method according to claim 1 in which said mass and said body are maintained in a non-oxidizing atmosphere.

3. A semi-conductor junction device produced by the method of claim 2.

4. The method according to claim 1 in which said mass is of indium and said body is of n-type semiconductive germanium.

5. The method according to claim 1 in which said semi-conductive body is of a material selected from class consisting of semi-conductive germanium and semiconductive silicon.

6. The method according to claim 1 in which said pressing provides a contact pressure upon said material of about 1000 to 10,000 pounds per square inch.

7. A method of making a P-N rectifying junction in a P-type semiconductive body comprising the steps of pressing a mass of a conductivity type-determining material selected from the group consisting of an alloy of lead and antimony, an alloy of lead and arsenic, and an alloy of lead and bismuth, upon the surface of said body at an elevated temperature below the melting points of said body and of said material, thereby to cause a portion of said material to diffuse into said body to change the conductivity type of a region of said body to N-type and to form a P-N rectifying junction in said body adjacent said region.

References Cited in the file of this patent

UNITED STATES PATENTS

| | | |
|---|---|---|
| 1,997,006 | Morris | Apr. 9, 1935 |
| 2,449,484 | Jaffe | Sept. 14, 1948 |
| 2,464,066 | Addink et al. | Mar. 8, 1949 |
| 2,560,594 | Pearson | July 17, 1951 |
| 2,561,411 | Pfann | July 24, 1951 |
| 2,603,693 | Kircher | July 15, 1952 |
| 2,629,039 | Shoemaker | Feb. 17, 1953 |
| 2,629,672 | Sparks | Feb. 24, 1953 |
| 2,697,052 | Dacey et al. | Dec. 14, 1954 |
| 2,743,201 | Johnson et al. | Apr. 24, 1956 |

OTHER REFERENCES

Lord: Alloy Systems, published by Pitman Publishing Co., N. Y., 1949, pages 52–57.

Samans: Engineering Metals and Thin Alloys, published by the Macmillan Co., N. Y., 1949, pages 265, 266 and 869.